United States Patent [19]

Akiyoshi

[11] Patent Number: 5,905,938
[45] Date of Patent: May 18, 1999

[54] METHOD OF MANUFACTURING A SEMICONDUCTOR SUBSTRATE MATERIAL

[75] Inventor: Naoyoshi Akiyoshi, Osaka, Japan

[73] Assignee: Toho Kinzoku Co., Ltd., Osaka, Japan

[21] Appl. No.: 08/793,251

[22] PCT Filed: Jun. 23, 1995

[86] PCT No.: PCT/JP95/01266

§ 371 Date: Apr. 28, 1997

§ 102(e) Date: Apr. 28, 1997

[87] PCT Pub. No.: WO97/01187

PCT Pub. Date: Jan. 9, 1997

[51] Int. Cl.[6] .................................................... B22F 3/12
[52] U.S. Cl. ................................................ 419/23; 419/38
[58] Field of Search .......................................... 419/38, 23

[56] References Cited

FOREIGN PATENT DOCUMENTS

| 0 113 088 | 7/1984 | European Pat. Off. . |
|---|---|---|
| 753 592 A1 | 1/1997 | European Pat. Off. . |
| 59-136952 | 8/1984 | Japan . |
| 59-141247 | 8/1984 | Japan . |
| 59-141248 | 8/1984 | Japan . |
| 59-143347 | 8/1984 | Japan . |
| 3-111524 | 5/1991 | Japan . |
| 5-271702 | 10/1993 | Japan . |

OTHER PUBLICATIONS

European Search Report for European Application No. EP 95 92 2755, dated Apr. 23, 1997.

*Primary Examiner*—Daniel J. Jenkins
*Attorney, Agent, or Firm*—Armstrong, Westerman, Hattori, McLeland & Naughton

[57] ABSTRACT

A material for a semiconductor substrate is composed substantially of tungsten and/or molybdenum mixed with 5–30 wt. % copper, 0.002–0.07 wt. % phosphorus, and 0.1–0.5 wt. % one or two materials selected from among cobalt, nickel, and iron. The material is manufactured by mixing together tungsten powder and/or molybdenum powder of 1 $\mu$m in particle size, copper powder of 7 $\mu$m in particle size, and small amounts of an iron-group metal and phosphorus or phosphorus compound, molding the mixture at a pressure of 1.0 ton/cm$^2$, and then, sintering the molded body at a temperature which allows solid and liquid to coexist below the melting point of copper.

4 Claims, No Drawings

5,905,938

METHOD OF MANUFACTURING A SEMICONDUCTOR SUBSTRATE MATERIAL

FIELD OF THE INVENTION

The present invention relates to a semiconductor substrate material used for a package for a semiconductor, a heat sink and the like, and a method of manufacturing same.

BACKGROUND OF THE INVENTION

As a material for a package for a semiconductor and a heat sink material, a copper-tungsten alloy having a thermal expansion coefficient close to that of semi-conductor and a high thermal conductivity has popularly been used.

Because copper and tungsten are not mutually dissolved into a solid-solution state, the copper-tungsten alloy is manufactured by powder metallurgy. The manufacturing methods based on powder metallurgy are broadly classified into the infiltration method and the powder mixing method. The infiltration method comprises compacting and sintering tungsten powder alone to form a porous tungsten skeleton, and impregnating the resultant skeleton with molten copper. The powder mixing method comprises compacting a powder mixture prepared by mixing copper powder and tungsten powder at a prescribed ratio, and sintering the resulting mixture at a temperature of at least the melting point of copper. While a material having similar properties is available also by using molybdenum or a mixture of tungsten and molybdenum in place of tungsten which is a refractory metal, tungsten is actually employed more often.

However, the infiltration method and the powder mixing method described above have the following problems. First, the infiltration method has drawbacks in that the necessity of the infiltrating step after the sintering step results in a long production line and the swollen copper deposit on the surface after infiltration requires machining of the entire surface, thus resulting in a high manufacturing cost. The powder mixing method has problems in that, because the material is sintered at a temperature higher by 200 to 300° C. than the melting point of copper, copper of a low viscosity in a liquified state excessively exudes onto the surface, resulting in an increase in surface roughness, occurrence of surface irregularities and a decrease in size accuracy. In the case of a stepped product, furthermore, leaching copper accumulates at the step corner which is thus rounded. In the powder mixing method, therefore, machining to the same order as in the infiltration method is required.

The present invention has therefore at object to provide a method of manufacturing a copper-bearing semiconductor substrate material, which solves the above-mentioned conventional problems, and which permits alleviation of a finishing operation.

DISCLOSURE OF THE INVENTION

To achieve the above-mentioned object, the present invention has the following construction. The method of manufacturing a semiconductor substrate material of the present invention comprises the steps of mixing tungsten powder and/or molybdenum powder having a particle size of up to 1$\mu$, copper powder having a particles size of up to 7$\mu$, and an iron-family metal and phosphorus or a phosphorus compound in a slight amount, compacting the mixture under a pressure of at least 1.0 ton/cm$^2$, and then sintering the thus compact at a temperature of a solid-liquid coexisting region lower than the melting point of copper, thereby obtaining a sintered compact body having a desired shape.

The semiconductor substrate material of the present invention comprises, in weight percent, from 5 to 30% copper, from 0.002 to 0.07% phosphorus, from 0.1 to 0.5% one or more selected from the group consisting of cobalt, nickel and iron, and the balance being substantially tungsten and/or molybdenum.

The package for a semiconductor of the present invention is characterized in that the semiconductor substrate material of the present invention is utilized as a semiconductor-mounting member or a radiator plate.

Now, the present invention is described in detail with reference to embodiments.

The present invention is characterized in that there is produced a solid-liquid coexisting state which is, non-existent for pure copper, and sintering is carried out at a temperature within this region. For this purpose, it suffices to add an iron-family metal and phosphorus in slight amounts to copper. In the case of an alloy containing 10% copper, 0.2% cobalt and 0.028% phosphorus (W-10Cu-0.2Co-0.028P), for example, the solid-liquid coexisting region covers a temperature range of from 1,060 to 1,080° C, which is lower than the melting point of copper of 1,083° C. As copper keeps a high viscosity in the solid-liquid coexisting state, the problem of large-quantity leaching of copper as described above is not posed.

According to the manufacturing method of the present invention, as described above, sintering is conducted within the solid-liquid coexisting region of copper. Sintering of a conventional alloy comprising copper and tungsten (molybdenum) alone at a temperature within the low-temperature region cannot however give a dense alloy. In the present invention, therefore, the following conditions should preferably be complied with.

Tungsten (as molybdenum can be used as a refractory metal in place of tungsten in almost the same manner, the following description covers only tungsten as a typical example) powder finer in size than the conventional one should be used with a view to accelerating sintering at a low temperature. The preferable average particle size is up to 1$\mu$. A larger particle size leads to a larger gap between particles, and this makes it difficult to accomplish packing through permeation of high-viscosity copper.

Copper powder, another raw material, should also be finer in size than the conventional one. For liquid-phase copper having a low viscosity, packing of gaps and rearrangement of tungsten particles do not occur as expected. Particles should therefore be uniformly and finely dispersed in advance. The copper particle size should preferably be up to 7$\mu$. A larger particle size of copper powder may cause cohesion of copper powder upon mixing as described later and may impair uniform dispersion. When using copper oxide powder in place of copper powder, particles tend to be easily crushed upon mixing. Copper oxide powder having a particles size of up to 10$\mu$ may therefore be employed. This copper oxide powder is reduced during the sintering step.

In addition to the above; an iron-family metal and phosphorus in slight amounts are added to the semi-conductor substrate material of the present invention. One or more of such iron-family metals as cobalt, iron and nickel should preferably be added in an amount of from 0.1 to 0.5 wt. %. According to a study made by the present inventors, addition of these iron-family metals and phosphorus makes available a solid-liquid coexisting region and improves surface activity of tungsten particles. Notwithstanding the low temperature, the copper-iron-family metal-phosphorus phase is excellent in function of wetting tungsten surfaces.

Phosphorus exhibits a deoxidation effect in a state dissolved into copper, and improves thermal conductivity.

Phosphorus should preferably be added in any of such forms as $Cu_3P$ (copper phosphide), a mixed powder with copper containing 8 wt. % phosphorus, $CO_2P$ (cobalt phosphide) and nickel phosphide. Copper phosphate powder may be directly mixed into the above-mentioned raw material powder. Perhaps because added phosphorus is consumed during the sintering step, the resultant copper-tungsten alloy contains (residual) phosphorus usually in an amount of 50 to 30 wt. % of the amount of addition. The amount of residual phosphorus (P) should preferably be from 0.002 to 0.07%.

Now, the method of manufacturing same is described in detail. First, copper powder, tungsten powder, phosphorous and iron-family metal powder, or cobalt powder, for example, are blended and mixed at a prescribed ratio. While iron or nickel may be used as an iron-family metal, use of cobalt is preferable, according to the result of an experiment carried out by the present inventors. It is desirable to conduct this mixing in wet (with alcohol) by using a milling machine such as a high-power stirring type ball mill using cemented carbide balls (trade name: ATTRITOR). During mixing, the cemented carbide balls impart large strain to copper powder and tungsten powder. This strain is considered to serve as a driving force accelerating sintering.

The resultant powder mixture is granulated by a conventional method and then compacted (pressed) into a desired shape. The compacting pressure should preferably be at least 1.0 ton/cm$^2$. A pressure lower than this level cannot give a sufficiently dense compact. By sintering this compact at a temperature within a solid-liquid coexisting region lower than the melting point of copper, an alloy in which copper and tungsten are uniformly dispersed is available. The alloy available by this method has a satisfactory surface condition since copper does not exude during sintering. In most cases, therefore, lapping or barrel polishing may suffice as the finishing treatment.

EXAMPLE 1

W-10%Cu-0.2%Co-0.028 P alloy was manufactured for trial under the following conditions. The raw material powder was commercially available tungsten powder having an average particle size of 0.86$\mu$, commercially available copper powder having an average particle size of 3.4$\mu$, commercially available cobalt powder having an average particle size of 1.5$\mu$, a copper-phosphorus powder mixture (hereinafter referred to as "8PCu") added with 8 wt. % phosphorus. The quantity of 8 PCu was selected so as to have the above-mentioned amount of residual P after sintering. Ethyl alcohol was added to these powder raw materials, and the resultant mixture was mixed in wet by means of an ATTRITOR (using cemented carbide balls).

PVP dissolved in ethyl alcohol was added as a granulating binder to the resultant metal powder mixture. The amount of added PVP was 1.0 wt. %. This powder mixture was granulated by a conventional method, and compacted by means of a mechanical press as a powder press. The compact had a size 32.5×32.5 ×1.3 (mm), and the compacting pressure was 1.5 tons/cm$^2$.

The resultant compact was sintered for 1.5 hours in a hydrogen atmosphere at a sintering temperature as shown in Table 1. The resultant sintered alloy mainly comprising copper and tungsten (semiconductor substrate material) had properties as shown in Table 1. While red color appeared on the surface, irregularities caused by excessive leaching were not observed. Alloys obtained under conditions outside the scope of the present invention are also shown as comparative examples in Table 1.

EXAMPLE 2

W-20Cu-0.2Co-0.028 P alloy was manufactured for trial under conditions similar to those in the Example 1. The powder raw materials were the same as in the Example 1, except that copper phosphate powder was employed as the phosphorus component and was directly mixed with the powder raw materials.

PVP dissolved in ethyl alcohol was added as a granulating binder to the resultant powder mixture. The amount of added PVP was 1.5 wt. %. This powder mixture was granulated by a conventional method and compacted by means of a mechanical press as a powder press. The formed product had a size 45×45×1.6 (mm), and the forming pressure was 1.5 tons/cm$^2$.

The compact thus obtained was sintered in a hydrogen atmosphere. The sintering temperature was as shown in Table 2. As a result of sintering, a copper-tungsten sintered alloy having a size 34'34×1.2 (mm) was obtained. This sintered alloy (semiconductor substrate material) mainly comprising copper and tungsten had properties as shown in Table 2. Comparative examples outside the scope of the present invention are also shown in Table 2. As is clear from Table 2, surface irregularities caused by excessive leaching of copper were not observed.

TABLE 1

|  | Sintering temperature (° C.) | Density ratio (%) (ratio relative to theoretical density) | Transverse Rupture strength (kgf/mm$^2$) | Thermal expansion coefficient (×10$^{-6}$/° C.) | Thermal conductivity (W/m · K) | Surface condition |
| --- | --- | --- | --- | --- | --- | --- |
| Example of | 1060 | 95.2 | 99 | 6.8 | 143 | Grey |
| the | 1065 | 96.3 | 100 | 6.8 | 145 | Grey |
| invention | 1070 | 97.1 | 115 | 6.8 | 150 | Grey |
|  | 1075 | 99.5 | 118 | 6.8 | 154 | Light red |
|  | 1080 | 99.9 | 120 | 6.8 | 158 | Light red |
| Comparative | 1050 | 92.3 | 60 | 6.2 | 115 | Grey |
| example | 1300 | 99.8 | 125 | 6.8 | 159 | Serious irregularities caused by leaching |
|  | 1400 | 99.9 | 122 | 6.8 | 158 | Serious irregularities caused by leaching |

TABLE 2

|  | Sintering temperature (° C.) | Density ratio (%) (ratio relative to theoretical density) | Transverse Rupture strength (kgf/mm$^2$) | Thermal expansion coefficient (×10$^{-6}$/° C.) | Thermal conductivity (W/m · K) | Surface condition |
|---|---|---|---|---|---|---|
| Example of the invention | 1060 | 95.5 | 98 | 8.0 | 182 | Grey |
|  | 1065 | 97.0 | 100 | 8.1 | 187 | Light red |
|  | 1070 | 97.8 | 110 | 8.1 | 185 | Light red |
|  | 1075 | 99.6 | 115 | 8.1 | 185 | Light red |
|  | 1080 | 99.8 | 113 | 8.0 | 190 | Red |
| Comparative example | 1050 | 93.4 | 65 | 7.5 | 153 | Grey |
|  | 1200 | 99.9 | 116 | 8.1 | 198 | Serious irregularities caused by leaching |
|  | 1300 | 99.8 | 114 | 8.0 | 193 | Serious irregularities caused by leaching |

Industrial Applicability

According to the present invention, as described above, it is possible to manufacture a semiconductor substrate material mainly comprising copper and tungsten (molybdenum) through a relatively simple process. The resultant material, while being a sinter containing copper, does not show surface irregularities caused by excessive leaching of copper, and can be finished into a final product through a simple finishing step.

What is claimed is:

1. A method of manufacturing a semiconductor substrate material, which comprises the steps of mixing tungsten powder and/or molybdenum powder having a particle size of up to 1$\mu$, copper powder having a particle size of up to 7$\mu$, and an iron-family metal in an amount of 0.1 to 0.5% by weight and phosphorus or a phosphorus compound in an amount sufficient to provide residual phosphorus in an amount of 0.002 to 0.07% by weight, compacting the mixture under the pressure of at least 1.0 ton/cm$^2$, and then sintering the resultant mixture at a temperature within a solid-liquid coexisting region lower than the melting point of pure copper, thereby obtaining a sintered product of a desired shape.

2. The method of manufacturing a semiconductor substrate material as defined in claim 1, wherein an alloy containing 10% copper, 0.2% cobalt and 0.028% phosphorus is compacted and then sintered at a solid-liquid coexisting region of 1,060° C. to 1,080° C.

3. The method of manufacturing a semiconductor substrate material as defined in claim 1, wherein said iron-family metal is selected from the group consisting of cobalt, iron and nickel.

4. The method of manufacturing a semiconductor substrate material as defined in claim 1, wherein said phosphorus is added as a phosphorus-containing material selected from the group consisting of copper phosphide, a mixed powder with copper containing 8 weight percent phosphorus, cobalt phosphide and nickel phosphide.

* * * * *